United States Patent [19]
Ismail et al.

[11] Patent Number: 5,045,514
[45] Date of Patent: Sep. 3, 1991

[54] SOL-GEL METHOD FOR MAKING COMPOSITE MULLITE/CORDIERITE CERAMICS

[75] Inventors: M. G. M. U. Ismail; Zenjiro Nakai; Hideo Tsunatori, all of Kumagaya, Japan

[73] Assignee: Chichibu Cement Co., Ltd., Japan

[21] Appl. No.: 575,180

[22] Filed: Aug. 30, 1990

[30] Foreign Application Priority Data

Aug. 30, 1989 [JP] Japan ................... 1-221544

[51] Int. Cl.$^5$ ............................... C04B 35/18
[52] U.S. Cl. ................... 501/119; 501/128; 501/153; 501/12; 252/315.5; 252/315.6; 252/315.7
[58] Field of Search ............... 501/5, 9, 12, 119, 128, 501/153; 252/315.5, 315.6, 315.7

[56] References Cited

U.S. PATENT DOCUMENTS

| | | | |
|---|---|---|---|
| 4,314,827 | 9/1982 | Leitheiser et al. | 501/12 X |
| 4,460,916 | 7/1984 | Hashimoto et al. | 428/446 X |
| 4,528,275 | 7/1985 | Hodge | 501/9 |
| 4,687,652 | 8/1987 | Yoldas et al. | 501/128 X |
| 4,888,314 | 12/1989 | Bernier et al. | 501/119 |
| 4,898,842 | 2/1990 | David | 501/9 |

Primary Examiner—Karl Group
Attorney, Agent, or Firm—King & Schickli

[57] ABSTRACT

A method for making composite mullite/cordierite ceramics comprises the steps of:
preparing a mullite-intensive sol by mixing alumina and silica sols together at an $Al_2O_3/SiO_2$ molar ratio of 1.37–1.76,
preparing a cordierite-intensive sol by mixing alumina, silica and magnesia sols together,
gelating a mixture of the mullite- and cordierite-intensive sols obtained at a weight ratio of 80:20–20:80
calcinating the thus obtained gel at 1200°–1400° C., and
compacting and sintering the thus calcinated material at 1300°–1450° C.

5 Claims, No Drawings

SOL-GEL METHOD FOR MAKING COMPOSITE MULLITE/CORDIERITE CERAMICS

BACKGROUND OF THE INVENTION

1. Field of the Invention

The present invention relates to a method for making composite mullite/cordierite ceramics used as integrated circuit (IC) substrate materials by way of example.

2. Prior Art

Mullite has now attracted attention as IC substrate materials for fast elements, since its strength is close to that of alumina heretofore well-available to this end and its coefficient of thermal expansion is close to that of silicon. Problems with mullite, however, are that its coefficient of thermal expansion is still larger than that of silicon and its dielectric constant is high.

Cordierite, on the other hand, excels in thermal shock resistance, heat resistance and chemical stability. As already pointed out, however, problems with this material are that its mechanical strength is relatively insufficient and its coefficient of thermal expansion is much lower than that of silicon.

Set out in Table 1 are various physical properties, typically the coefficient of thermal expansion $\alpha$ ($10^{-6}$/°C.) (measured at 25°–800° C.), dielectric constant $\epsilon$ (measured at 25° C. and 1 MHz) and flexural strength $\sigma$ (MPa) of alumina, mullite and cordierite.

TABLE 1

| Physical Properties | Alumina | Mullite | Cordierite | Silicon |
|---|---|---|---|---|
| $\alpha$* | 8.1 | 5.6 | 1.5 | 3–4 |
| $\epsilon$* | 9.5 | 6.6 | 5.0 | |
| $\sigma$* | 350 | 270 | 245 | |

*$\alpha$ - Coefficient of thermal expansion (10$^{-6}$/°C.) (measured at 25–800° C.).
*$\epsilon$ - Dielectric constant (measured at 25° C. and 1 MHz).
*$\sigma$ - Flexural strength (MPa).

In view of the foregoing, it has been attempted to form composite mullite/cordierite ceramics into substrate materials for LSIs, etc.

For instance, a ceramic substrate consisting substantially of 0.5–5.0% by weight of MgO and 95.0–99.5% by weight of $Al_2O_3+SiO_2$, with the weight ratio of $Al_2O_3$ to $SiO_2$ being in the range of 50:50 to 80:20, has been proposed (Japanese Patent Publication No. 61-15532, and "Yōgyō Kyōkaishi", 95(10), pp. 1037–1039, 1987).

However, the method for making composite mullite/cordierite ceramics by powder mixing, set forth in these publications, poses problems that the resulting sintered compacts are so uneven in microstructure that their physical properties vary largely with a drop of their strength.

In particular, the content of MgO exceeding 5 wt. % causes an increase in the amount of spinel formed, offering problems that the coefficient of thermal expansion and dielectric constant increase. A certain limitation is placed on the amount of cordierite to be incorporated as well. For instance, any sintered compact having a dielectric constant of 6.5 or lower can never be obtained. Nor are sintered compacts rich in mechanical strength obtainable, because any sintering density exceeding 2.5 g/cm$^3$ cannot be obtained at a relatively low sintering temperature, say, 1450° C. In addition, the coefficient of thermal expansion achieved is relatively high, say, 3.8–3.9×10$^{-6}$/°C. at best. Thus, some limits are imposed on improving the properties of substrate materials.

In another effort heretofore made (see "Am. Ceram. Soc. Bull.", Vol. 63, No. 5, 705 (1984), mullite powders are mixed with coerdierite glass powders to make composite mullite/cordierite ceramics. A problem with this cordierite-glass-adding technique, however, is that no sufficient sintering takes place, failing to give densified sinterings.

For instance, even sintering of a mixture of mullite powders with cordierite glass powder at a mixing ratio of 80:20–60:40 and at a temperature in the range of 1450°–1455° C. gives a density of barely about 60–72% of theoretical density.

In yet another effort, composite mullite/cordierite ceramics are produced by an alkoxide technique (see "Nihon Ceramics Kyōkai Gakujutsu Ronbunshi", Vol. 96, No. 6, 659(1988)). Problems with this technique, however, are that the starting material is costly; the remaining glass phase causes a drop of strength; and any intimately sintered product cannot be obtained due to carbon residues.

SUMMARY OF THE INVENTION

It is accordingly a primary object of the present invention to provide a method for making composite mullite/cordierite ceramics having an increased sintering strength and an enriched mechanical strength, in which sintering can be carried out even at a relatively low temperature, say, 1450° C.

It is another object of this invention to provide a method for making composite mullite/cordierite ceramics having an increased sintering density and so not much pores, in which sintering can be carried out even at a relatively low temperature, say, 1450° C. When this ceramic product is used as an IC substrate, a signal pattern formed on its surface is unlikely to break down, since it is substantially rid of pores. Nor does a temperature rise produce an adverse influence on an integrated circuit such as an LSI mounted on the substrate, because water is unlikely to stay therein due to the absence of pores.

Yet another object of this invention is to provide a method for making composite mullite/cordierite ceramics having a dielectric constant as low as 5.2, as will be described in Example 4. By using this ceramic product as an IC substrate, it is possible to improve the transmission properties of an integrated circuit mounted on it.

Still another object of this invention is to provide a method for making composite mullite/cordierite ceramics having a coefficient of thermal expansion, say, 3–4×10$^{-6}$/°C., the figures being close to that of silicon.

According to the present invention, the above-mentioned objects are achievable by the provision of a method for making composite mullite/cordierite ceramics characterized by including the steps of:

preparing a mullite-intensive sol by mixing alumina and silica sols together, preparing a cordierite-intensive sol by mixing alumina, silica and magnesia sols together, gelating a mixture of the mullite- and cordierite-intensive sols, calcinating the thus obtained gel, and compacting and sintering the thus calcinated material.

DETAILED EXPLANATION OF THE INVENTION

The present invention will now be explained in greater detail.

In the present invention, the mullite-intensive sol should preferably be prepared by mixing the alumina and silica sols together at an $Al_2O_3/SiO_2$ molar ratio of 1.37 to 1.76. Preferably, the mullite- and cordierite-intensive sols are mixed together at a weight ratio of 80:20 to 20:80. It is desired that calcination be carried out at a temperature in the range of 1200° to 1400° C. and sintering at a temperature in the range of 1300° to 1450° C.

In the present invention, the mullite- and cordierite-intensive sols should be separately prepared beforehand for the following reasons.

Separate preparation of the mullite- and cordierite-intensive sols gives basic networks of mullite and cordierite. Accordingly, it is unlikely that an extra third component may be contained in a sintered product obtainable from a powder feed formed by mixing together, gelating and calcinating both sols. In addition, cordierite is uniformly dispersed throughout the mullite structure.

The mullite-intensive sol should preferably be regulated to an $Al_2O_3/SiO_2$ molar ratio in the range of 1.37 to 1.76 for the following reasons.

Cristobalite ($SiO_2$) tends to crystallize out at an $Al_2O_3/SiO_2$ ratio less than 1.37, while corrundum ($\alpha$-$Al_2O_3$) tends to crystallize out at an $Al_2O_3/SiO_2$ ratio more than 1.76.

In order to synthesize a high-purity mullite, therefore, it is desired that the molar ratio of $Al_2O_3/SiO_2$ be in the range of 1.37 to 1.76.

The mullite- and cordierite-intensive sols should preferably be mixed together at a weight ratio in the range of 80:20 to 20:80 for the following reasons.

At below 80:20, there is a tendency for the resulting phase to consist only of mullite. By contrast, there is a tendency for the resulting phase of consist only of cordierite at higher than 20:80.

Calcination should preferably carried out at a temperature in the range of 1200° to 1400° C. for the following reasons.

At below 1200° C., mullite is not crystallized and so would be ill-sintered, giving a sintered product likely to crack. At higher than 1400° C., on the contrary, the feed powders would be sintered excessively, giving a sintered product harder to pulverize due to increased shrinkage.

Sintering should preferably be performed at a temperature in the range of 1300° to 1400° C. for the following reasons.

No sufficiently increased sintering density can be obtained at below 1300° C., while a glassy phase tends to grow at higher than 1400° C.

The present invention will now be explained specifically but not exclusively with reference to the following examples, in which all percentages are given by weight.

EXAMPLES 1-8

Alumina, silica and magnesia sols were first prepared as the sol feeds in the following manners.

The alumina (boehmite) sol was prepared by adding commercially available boehmite powders (Catapal B containing 73.0 wt % of $Al_2O_3$, commercialized by Vista Chemical, Ltd.) together with nitric acid to ion exchanged water and heating the solution under normal pressure at 80° C. for 3 hours.

The silica sol was obtained by adding commercially available colloidal silica powders (Nipsil E220A containing 92.4 wt % of $SiO_2$, commercialized by Nippon Silica, Ltd.) together with nitric acid to ion exchanged water and regulating the pH of the solution to 3 or less at normal temperature.

The magnesia sol was obtained by dispersing a guaranteed reagent $MgCl_2.6H_2O$ (commercialized by Kanto Kagaku K. K.) into ion exchanged water and then adding an aqueous solution containing a given amount of hexamethylenetetramine to the dispersion.

The alumina and silica sols were then mixed together at varied $Al_2O_3/SiO_2$ molar ratios between 1.37 and 1.76 to prepare mullite-intensive sols.

Similarly, the alumina, silica and magnesia sols were mixed together at $MgO:Al_2O_3:SiO_2=2:2:5$, a theoretical composition of cordierite, thereby preparing cordierite-intensive sols.

The thus obtained mullite- and cordierite-intensive sols were mixed together at varied weight ratios between 80:20 and 20:80, and the mixtures were then mechanically agitated at pH 2.5, following by being allowed to stand for 1 hour for gelation. The resulting gels were finally dried at 120° C. for 18 hours.

The dried gels were pulverized over 6 hours by means of a ball mill, and then screened out through a 100-mesh sieve. The thus obtained gel powders were calcinated for about 1 hours at temperatures lying between 1100° C. and 1500° C. The calcinated products were pulverized to an average particle size of about 1.5 $\mu m$ by means of a wet ball mill to obtain slurries, which were then dried at 120° C. for 18 hours. The obtained products were thereafter crushed to powders.

The powders were pressed under a hydrostatic pressure of 2.0 $t/cm^2$, followed by sintering at 1450° C. for 3 hours.

As a result of X-ray diffraction of the crystal phases of the sintered samples, it has been found that they are all composed only of mullite and cordierite phases, with no other phase detected at all.

Test pieces measuring $4\times3\times40$ mm were cut out of the sintered samples to measure their strength by three-point bending testing. The test pieces all showed a value of 20 $kg/mm^2$ or more.

The sintered samples had also an average coefficient of thermal expansion of $3.0-4.4\times10^{-6}/°C.$ close to that of silicon, as measured at temperatures from room temperature to 400° C.

Dielectric constants of 5.2-7.0 were obtained, the figures being lower than that of alumina.

The results are summarized in Table 2.

TABLE 2

| No. | Mullite $Al_2O_3/SiO_2$ | Mullite (wt %) | Cordierite (wt %) | Pre-Sintering Temp. (°C.) | Sintering Temp. (°C.) | Sintering Density (g/cm$^3$) | Flexural Strength (kgf/mm$^2$) | Coefficient of Thermal Expansion ($\times 10^{-6}/°C.$) | Dielectric Constant | Phase |
|---|---|---|---|---|---|---|---|---|---|---|
| Ex. 1 | 1.50 | 80 | 20 | 1300 | 1450 | 2.98 | 34 | 4.2 | 6.5 | M, C |

TABLE 2-continued

| No. | Mullite Al$_2$O$_3$/SiO$_2$ | (wt %) | Cordierite (wt %) | Pre-Sintering Temp. (°C.) | Sintering Temp. (°C.) | Sintering Density (g/cm$^3$) | Flexural Strength (kgf/mm$^2$) | Coefficient of Thermal Expansion ($\times 10^{-6}$/°C.) | Dielectric Constant | Phase |
|---|---|---|---|---|---|---|---|---|---|---|
| Ex. 2 | 1.50 | 60 | 40 | 1300 | 1450 | 2.85 | 32 | 3.4 | 6.0 | M, C |
| Ex. 3 | 1.50 | 40 | 60 | 1300 | 1450 | 2.73 | 25 | 3.1 | 5.4 | M, C |
| Ex. 4 | 1.50 | 20 | 80 | 1300 | 1450 | 2.58 | 22 | 3.0 | 5.2 | M, C |
| Ex. 5 | 1.37 | 60 | 40 | 1300 | 1450 | 2.63 | 25 | 4.0 | 6.8 | M, C |
| Ex. 6 | 1.76 | 60 | 40 | 1300 | 1450 | 3.02 | 28 | 4.4 | 7.0 | M, C |
| Ex. 7 | 1.50 | 60 | 40 | 1200 | 1450 | 2.78 | 25 | 3.4 | 6.0 | M, C |
| Ex. 8 | 1.50 | 60 | 40 | 1400 | 1450 | 2.85 | 28 | 3.3 | 6.0 | M, C |
| Comp. Ex. 1 | 1.50 | 100 | — | 1400 | 1650 | 3.12 | 35 | 4.5 | 7.3 | M |
| Comp. Ex. 2 | — | — | 100 | 1440 | 1450 | 2.50 | 18 | 1.0 | 5.0 | C |

M - Mullite; C - Cordierite

As mentioned above, the present invention provides a method for making composite mullite/cordierite ceramics characterized by comprising the steps of:

preparing a mullite-intensive sol by mixing alumina and silica sols together, preparing a cordierite-intensive sol by mixing alumina, silica and magnesia sols together, gelating a mixture of the mullite- and cordierite-intensive sols, calcinating the thus obtained gel, and compacting and sintering the thus calcinated material. Thus, even when carried out at a relatively low sintering temperature, say, 1450° C., the present invention can successively give composite mullite/cordierite ceramics having an increased sintering strength, an enriched mechanical strength and not much pores. When this ceramic product is used as an IC substrate, a signal pattern formed on its surface is unlikely to break down, since it is substantially rid of pores. Nor does a temperature rise have an adverse influence upon an integrated circuit such as LSI mounted on the substrate. By using this ceramic product having a decreased dielectric constants as an IC substrate, it is also possible to improve the transmission properties of an integrated circuit mounted on it. In addition, the ceramics according to the present invention has a coefficient of thermal expansion, say, $3-4 \times 10^{-6}$/°C., the figures being close to that of silicon.

We claim:

1. A method for making composite mullite/cordierite ceramics comprising the steps of:

preparing a mullite-intensive sol by mixing alumina and silica sols together, preparing a cordierite-intensive sol by mixing alumina, silica and magnesia sols together, gelating a mixture of the mullite- and cordierite-intensive sols, calcinating the obtained gel, and compacting and sintering the calcinated gel material.

2. A method for making composite mullite/cordierite ceramics as claimed in claim 1, wherein said alumina and silica sols are mixed together to prepare said mullite-intensive sol having an Al$_2$O$_3$/SiO$_2$ molar ratio in the range of 1.37 to 1.76.

3. A method for making composite mullite/cordierite ceramics as claimed in claim 1, wherein said mullite- and cordierite-intensive sols were mixed together at a weight ratio of 80:20 to 20:80.

4. A method for making composite mullite/cordierite ceramics as claimed in claim 1, wherein the calcination is carried out at a temperature in the range of 1200° to 1400° C.

5. A method for making composite mullite/cordierite ceramics as claimed in claim 1, wherein the sintering is carried out at a temperature in the range of 1300° to 1450° C.

* * * * *